United States Patent
Marsan et al.

(10) Patent No.: US 9,214,906 B2
(45) Date of Patent: Dec. 15, 2015

(54) SYSTEMS AND METHODS FOR PROVIDING HIGH AND LOW ENABLE MODES FOR CONTROLLING RADIO-FREQUENCY AMPLIFIERS

(71) Applicant: SKYWORKS SOLUTIONS, INC., Woburn, MA (US)

(72) Inventors: Eric Marsan, Lowell, MA (US); Ambarish Roy, Lowell, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 191 days.

(21) Appl. No.: 13/934,043

(22) Filed: Jul. 2, 2013

(65) Prior Publication Data

US 2014/0002190 A1     Jan. 2, 2014

Related U.S. Application Data

(60) Provisional application No. 61/667,388, filed on Jul. 2, 2012.

(51) Int. Cl.
    *H03F 1/14*     (2006.01)
    *H03F 3/217*     (2006.01)
    *H03F 3/193*     (2006.01)
    *H03F 3/72*     (2006.01)

(52) U.S. Cl.
    CPC ............... *H03F 3/217* (2013.01); *H03F 3/193* (2013.01); *H03F 3/72* (2013.01)

(58) Field of Classification Search
    CPC ....... H03F 3/245; H03F 3/211; H03F 1/0277; H03F 1/223; H03F 3/193; H03F 3/195; H03F 3/2171; H03F 3/45071; H03F 3/68; H03F 1/3205

USPC .................. 330/51, 124 R, 295, 310, 311
See application file for complete search history.

(56) References Cited

U.S. PATENT DOCUMENTS 7,030,690 B2 *   4/2006   Dvorak ........................ 330/51
7,486,135 B2 *   2/2009   Mu ............................... 330/51
7,554,406 B2 *   6/2009   Fasoli et al. ................. 330/286

(Continued)

FOREIGN PATENT DOCUMENTS

KR   10-1999-0047215 A   7/1999
KR   10-2002-0060223 A   7/2002

OTHER PUBLICATIONS

International Search Report and Written Opinion issued on Dec. 18, 2013 in connection with corresponding PCT Application No. PCT/US2013/049128.

(Continued)

*Primary Examiner* — Khanh V Nguyen
(74) *Attorney, Agent, or Firm* — Fernando Hale & Chang LLP

(57) ABSTRACT

Disclosed are circuits, devices, systems and methods related to an enable circuit for a radio-frequency (RF) amplifier. In some embodiments, the enable circuit can be configured to control a low-noise amplifier (LNA). The enable circuit includes a plurality of input ports, with each input ports being configured to receive a control signal. The enable circuit further includes a logical section connected to the input ports and configured to be capable of generating a plurality of output signals based on different combinations of the plurality of control signals. The output signals include either or both of enable and power shut-off signals for the LNA.

20 Claims, 11 Drawing Sheets

(56) References Cited

U.S. PATENT DOCUMENTS

| | | |
|---|---|---|
| 8,022,772 B2 * | 9/2011 | Cassia et al. .................. 330/311 |
| 2005/0052245 A1 | 3/2005 | Rofougaran |
| 2007/0066243 A1 | 3/2007 | Yamauchi et al. |
| 2009/0161588 A1 | 6/2009 | Maldonado et al. |

OTHER PUBLICATIONS

International Preliminary Report on Patentability issued on Jan. 6, 2015 in connection with corresponding PCT Application No. PCT/US2013/049128.

* cited by examiner

SYSTEMS AND METHODS FOR PROVIDING HIGH AND LOW ENABLE MODES FOR CONTROLLING RADIO-FREQUENCY AMPLIFIERS

CROSS-REFERENCE TO RELATED APPLICATIONS

This application claims priority to U.S. Provisional Application No. 61/667,388 filed Jul. 2, 2012 and entitled "SYSTEMS AND METHODS FOR PROVIDING HIGH AND LOW ENABLE MODES FOR CONTROLLING RADIO-FREQUENCY AMPLIFIERS," which is expressly incorporated by reference herein in its entirety.

BACKGROUND

1. Field

The present disclosure generally relates to circuits and method for controlling radio-frequency (RF) amplifiers, and more particularly, to an enable circuit capable of generating enable signals for different operating modes of RF amplifiers such as low-noise amplifiers (LNAs).

2. Description of the Related Art

Many radio-frequency (RF) devices such as wireless devices include amplifiers. For example, a low-noise amplifier (LNA) receives a relatively weak RF signal from an antenna and amplifies the signal. The amplified signal is then provided to a receiver circuit for further processing.

Such an LNA is typically configured to receive an enable signal to facilitate such an amplification operation. The LNA can also be configured to receive a disable signal to cease operation of the LNA.

SUMMARY

According to a number of implementations, the present disclosure relates to an enable circuit for a radio-frequency (RF) amplifier. The enable circuit includes a plurality of input ports, with each input ports being configured to receive a control signal. The enable circuit further includes a logical section connected to the input ports and configured to be capable of generating a plurality of output signals based on different combinations of the plurality of control signals. The output signals include either or both of an enable signal and a power shut-off signal for the RF amplifier.

In some embodiments, the RF amplifier can be a low-noise amplifier (LNA). The plurality of input ports can includes an ENABLE_A port, an ENABLE_B port, and an ENABLE PULL-UP B port. The ENABLE PULL-UP B port being unconnected and the ENABLE_A port being provided with a ground potential can result in an active high enable signal for the RF amplifier. The ENABLE_B port being floated or provided with a voltage less than approximately 1.5V can result in the RF amplifier being OFF. The ENABLE_B port being provided with a positive voltage of approximately 1.5V or higher can result in the RF amplifier being ON.

In some embodiments, the ENABLE_B port being unconnected and the ENABLE PULL-UP B port being provided with a voltage of RF_OUT −5V can result in a low enable signal for the RF amplifier. The ENABLE_A port being floated or provided with a voltage less than approximately 1.5V can result in the RF amplifier being ON. The ENABLE_A port being provided with a positive voltage of approximately 1.5V or higher can result in the RF amplifier being OFF.

In some embodiments, the logical section can include a first field-effect transistor (FET), a second FET, and a third FET, with each FET having a gate, a source, and a drain. Each source can be connected to a ground, and each drain can be connected to its respective voltage source. The gate of the first FET can be coupled to a first input port, the gate of the second FET can be coupled to the drain of the first FET, and the gate of the third FET can be coupled to the drain of the second FET.

In some embodiments, the logical section can further include a fourth FET implemented between the second FET and the ground. The gate of the fourth FET can be coupled to a second input port. The drain of the fourth FET can be coupled to the source of the second FET. The source of the fourth FET can be coupled to the ground.

In some embodiments, the control circuit can further include a pull down FET implemented between a source of a bias voltage (V_BIAS) and the ground. The pull down FET can be configured to allow the bias voltage to be shunted away from the RF amplifier. The pull down FET can have a gate coupled to the drain of the second FET, a drain coupled to the source of the bias voltage, and a source coupled to the ground.

In accordance with some implementations, the present disclosure relates to a method for generating control signals for a radio-frequency (RF) amplifier. The method includes applying a plurality of control signals to their respective ports of a control circuit. The method further includes performing a plurality of switching operations in the control circuit based on the control signals. Different combinations of the control signals yield a plurality of different output signals, with the different output signals including either or both of an enable signal and a power shut-off signal for the RF amplifier.

In some teachings, the present disclosure relates to a semiconductor die that includes a semiconductor substrate. The die further includes a radio-frequency (RF) amplifier formed on the semiconductor substrate. The die further includes a control circuit formed on the semiconductor substrate. The control circuit is configured to be capable of generating a plurality of different output signals for the RF amplifier based on different combinations of a plurality of control signals, with the different output signals including either or both of an enable signal and a power shut-off signal for the RF amplifier.

In some embodiments, the RF amplifier can be a low-noise amplifier (LNA). In some embodiments, the die can further include an active bias circuit configured to provide a bias signal to the RF amplifier, with the bias signal being representative of an operating condition of the RF amplifier.

In some embodiments, the control circuit can include a plurality of field-effect transistors (FETs) configured to generate the output signals based on the control signals. In some embodiments, the die can further include a voltage drop circuit connected between the control circuit and a high voltage node. The voltage drop circuit can be configured to deliver a plurality of desired voltages to the plurality of the FETs.

In some implementations, the present disclosure relates to a method for fabricating a semiconductor die. The method includes providing a semiconductor substrate. The method further includes forming a radio-frequency (RF) amplifier on the semiconductor substrate. The method further includes forming a control circuit on the semiconductor substrate. The control circuit is configured to be capable of generating a plurality of different output signals for the RF amplifier based on different combinations of a plurality of control signals. The different output signals include either or both of an enable signal and a power shut-off signal for the RF amplifier.

According to a number of implementations, the present disclosure relates to a radio-frequency (RF) amplifier module that includes a packaging substrate configured to receive a plurality of components. The module further includes a semiconductor die mounted on the packaging substrate, with the die having an RF amplifier. The module further includes a control circuit coupled to the RF amplifier and configured to be capable of generating a plurality of different output signals for the RF amplifier based on different combinations of a plurality of control signals. The different output signals include either or both of an enable signal and a power shut-off signal for the RF amplifier.

In some embodiments, the control circuit can be part of the same semiconductor die as the RF amplifier. In some embodiments, the control circuit can be part of another die mounted on the packaging substrate. In some embodiments, the control circuit can be disposed at a location outside of the semiconductor die. In some embodiments, the module can be a power amplifier module (PAM). In some embodiments, the module can be a low-noise amplifier (LNA) module.

In a number of implementations, the present disclosure relates to a wireless device that includes a transceiver configured to process radio-frequency (RF) signals. The wireless device further includes an antenna in communication with the transceiver. The antenna is configured to facilitate reception of an RF signal. The wireless device further includes a low-noise amplifier (LNA) connected to the antenna and configured to amplify the RF signal. The wireless device further includes a control circuit coupled to the LNA and configured to be capable of generating a plurality of different output signals for the LNA based on different combinations of a plurality of control signals. The different output signals include either or both of an enable signal and a power shut-off signal for the LNA.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In wireless applications, radio-frequency (RF) amplifier designs can specify different enable functionalities. For example, a high-state (e.g., an active high state) operation of an RF amplifier such as a low-noise amplifier (LNA) can require one enable configuration, while a low-state (e.g., an active low state) operation can require another enable configuration.

By way of an example in the context of LNAs, it is noted that E-mode LNAs can have designs having different enable/disable functionalities. For a given LNA design, fabrication of wafers with different LNA/enable-circuit combinations is typically not cost-effective.

Described herein are various examples of circuits, devices, systems and methods that allow different enable functionalities to be included in a single circuit. In the context of amplification configurations having active high and active low states, various examples of enable circuits that can be configured to operate in either state are described. Although described in the context of active biasing examples, it will be understood that one or more features of the present disclosure can also be implemented in systems having other types of biasing configurations. It will also be understood that in the description herein, an "enable" functionality can have a corresponding disable functionality. For example, an enable circuit can be configured to disable a state of an LNA.

Figure 1:
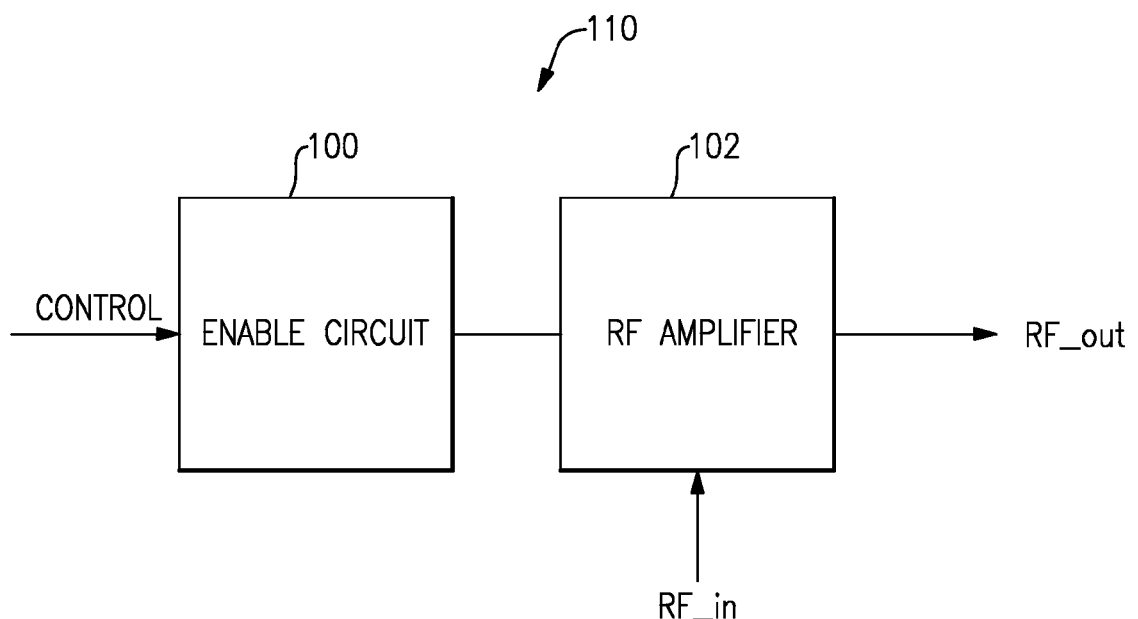
FIG. 1 schematically shows that in some implementations, an enable circuit having one or more features as described herein can be coupled to and control a radio-frequency (RF) amplifier.

FIG. 1 schematically shows an example configuration 110 for enabling a radio-frequency (RF) amplifier 102. The RF amplifier 102 is shown to receive an input RF signal (RF_in) and generate an amplified RF signal (RF_out). Such an operation of the amplifier 102 can be facilitated by a control logic enable circuit 100. As described herein, the enable circuit 100 can be configured to receive control signals and allow the amplifier 102 to be powered down with more than one enable states. When the amplifier 102 is not in an enable state it typically provides no amplification and can be partially shut down to consume much less energy.

Figure 2:
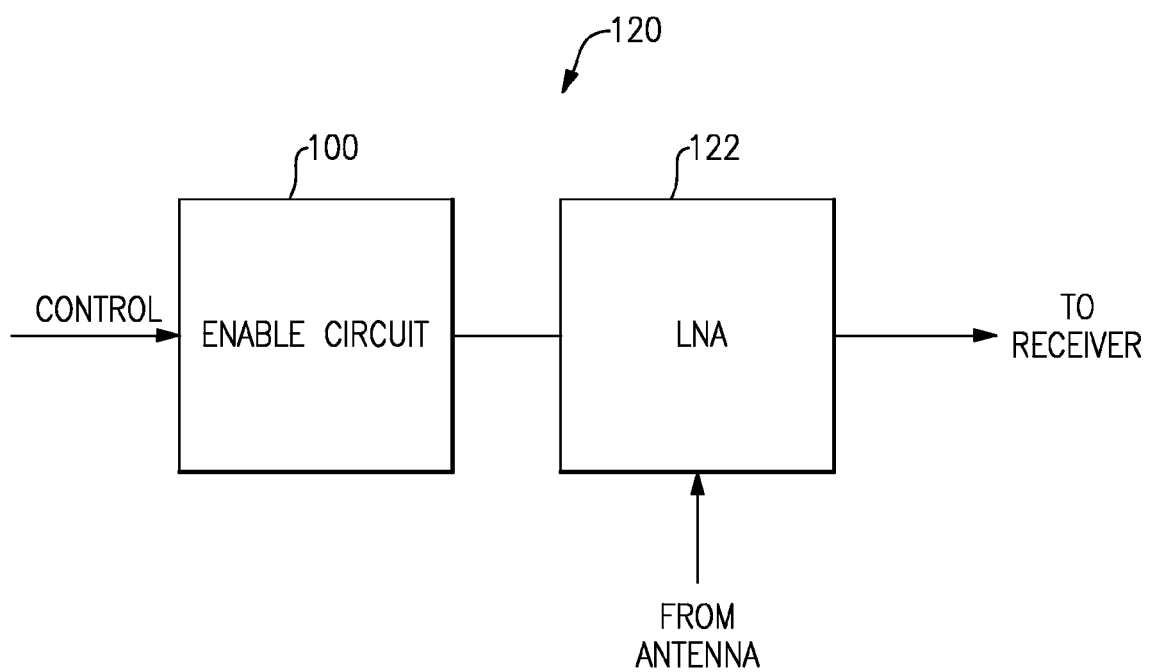
FIG. 2 shows that in some embodiments, the RF amplifier of FIG. 1 can be a low-noise amplifier (LNA).

FIG. 2 schematically shows that in some embodiments, the enable circuit 100 of FIG. 1 can be implemented in a configuration 120 where the RF amplifier is a low-noise amplifier (LNA) 122. Such an LNA can be utilized to, for example, amplify a relatively weak RF signal from an antenna, amplify it with relatively low noise, and send the amplified signal to a receiver circuit (e.g., part of a transceiver). The enable circuit 100 can be configured to receive control signals and allow the LNA 122 to be operated in more than one enable states. Although some or all of the features of such an enable circuit are described herein in the context of LNAs, it will be understood that such features can also be implemented in other types of RF amplifiers, including, for example, power amplifiers (PAs) that are used to amplify to-be-transmitted RF signals.

The foregoing capability of a power shut-off enable circuit can be desirable in a number of situations. For example, there is an increasing demand for logical shut-off functionalities in some amplifier designs. Such shut-off functionalities can include "Active High" and "Active Low" states to enable/disable an LNA, where some designs call for high enable functionality while other designs call for low enable functionality, depending on system requirements.

Described herein are various examples of enable circuits, related devices, related systems, and related methods that allow LNAs to operate in either of the two states based on control inputs. Although described in the context of two states, one or more features of the present disclosure can also be implemented for operation in more than two states. In some implementations, such control inputs can be selected from logical conditions utilized or required by a microcontroller associated with a given system design. If there are no requirements for any enable/disable function, an enable circuit having one or more features as described herein can be disabled as well.

Figure 3A:
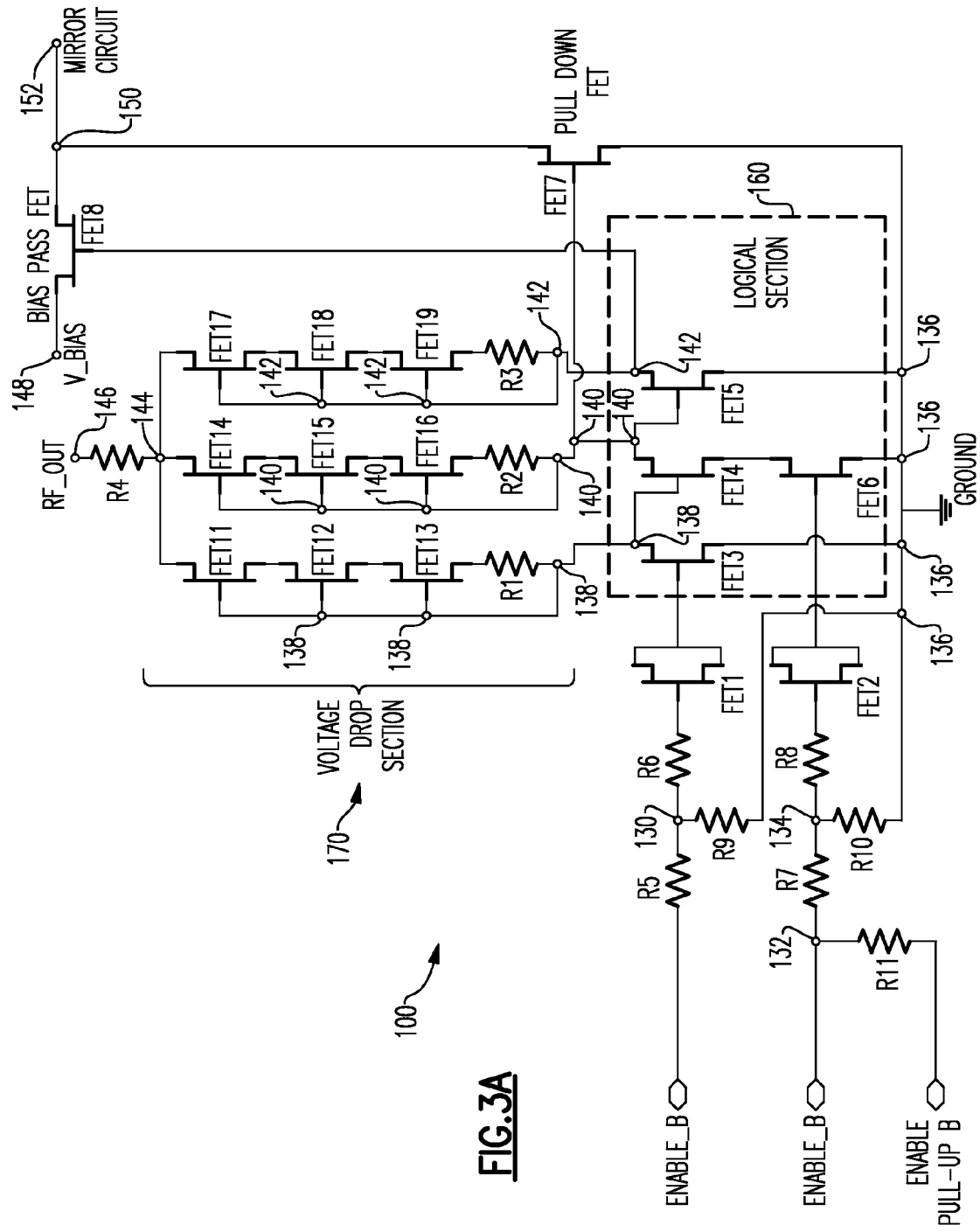
FIG. 3A shows an example of the enable circuit of FIG. 1 or FIG. 2.

FIG. 3A shows a more detailed example of an enable circuit 100 of FIGS. 1 and 2. The enable circuit 100 is shown to include a LOGICAL SECTION 160 having a plurality of FETs (FET3, FET4, FET5, FET6) arranged as shown. More specific examples of these FETs are described herein in greater detail.

The LOGICAL SECTION 160 is shown to receive control input signals through ports indicated as ENABLE_A, ENABLE_B, and ENABLE PULL-UP B. A signal received at the port ENABLE_A is shown to be routed to the gate of FET3, through a resistance (e.g., a resistor) R5, a resistance (e.g., a resistor) R6, and an FET configured as a diode (FET1). A resistance (e.g., a resistor) R9 is shown to connect a node 130 that is between R5 and R6 with a ground (node 136).

A signal received at the port ENABLE_B is shown to be routed to the gate of FET6, through a resistance (e.g., a resistor) R7, a resistance (e.g., a resistor) R8, and an FET configured as a diode (FET2). A resistance (e.g., a resistor) R10 is shown to connect a node 134 that is between R7 and R8 with the ground (node 136).

A signal received at the port ENABLE PULL-UP B is shown to be routed to a node 132 of the ENABLE_B port through a resistance (e.g., a resistor) R11. More specific examples of FET1, FET2, and R5-R11 are described herein in greater detail.

In the example shown, operation of the enable circuit 100 can be facilitated by a high voltage supply (e.g., from an RF_OUT node 146 of an LNA). It will be understood that such a high voltage supply can be obtained from other nodes. The LOGICAL SECTION 160 is shown to receive a desired voltage from the RF_OUT node 146, through a resistance (e.g., a resistor) R4 and a VOLTAGE DROP SECTION 170. The VOLTAGE DROP SECTION 170 is shown to include three arms, one for each of FET3, FET4, FET5 of the LOGICAL SECTION 160. Each of the three arms can be configured to deliver a desirable voltage to its corresponding FET in the LOGICAL SECTION 160 by selective turning ON or OFF of the FETs in the arm.

In the example shown, the drain of FET3 (at node 138) of the LOGICAL SECTION 160 is shown to be coupled to the RF_OUT node 146, through R4 and a common node 144, and through a first arm that includes FET11, FET12 and FET13 connected in series (e.g., for a desired drop in high voltage) and a resistance (e.g., a resistor) R1. Similarly, the drain of FET4 (at node 140) of the LOGICAL SECTION 160 is shown to be coupled to the RF_OUT node 146, through R4 and the common node 144, and through a second arm that includes FET14, FET15 and FET16 connected in series (e.g., for a desired drop in high voltage) and a resistance (e.g., a resistor) R2. Similarly, the drain of FET5 (at node 142) of the LOGICAL SECTION 160 is shown to be coupled to the RF_OUT node 146, through R4 and the common node 144, and through a third arm that includes FET17, FET18 and FET19 connected in series (e.g., for a desired drop in high voltage) and a resistance (e.g., a resistor) R3. More specific examples of R1-R4 and FET11-FET19 are described herein in greater detail.

In the first arm, the gates of the three FETs can be connected together and held at the same potential as that of the node 138 between R1 and FET3. Similarly, in the second arm, the gates of the three FETs can be connected together and held at the same potential as that of the node 140 between R2 and FET4. Similarly, in the third arm, the gates of the three FETs can be connected together and held at the same potential as that of the node 142 between R3 and FET5.

In the examples described herein, the gate of FET3 is coupled to ENABLE_A, and the gate of FETE is coupled to ENABLE_B. A drain of FET3 (at node 138) is connected to the gate of FET4, and a drain of FET4 (at node 140) is connected to the gate of FET5.

The drain of FET4 (at node 140) is also shown to be connected to the gate of FET7 which is a pull down FET that couples a MIRROR CIRCUIT (at node 152 and node 150) to the ground (node 136) and provides a circuit to ground the bias voltage to the amplifier. A drain of FET5 (at node 142) is shown to be connected to the gate of FET8 which is a bias pass FET enabling a passage of bias voltage to the amplifier. The bias pass FET (FET8) is shown to act as a switch for bias voltage V_BIAS (at node 148) being supplied to the amplifier (at node 152). More specific examples of FET7 and FET8 are described herein in greater detail.

Table 1 lists example values that can be utilized for the resistances R1-R11. Table 2 lists example configurations that can be utilized for the transistors FET1-FET8 and FET11-FET19.

TABLE 1

| Resistance | Value (approximate) |
| --- | --- |
| R1 | 10 KΩ |
| R2 | 10 KΩ |
| R3 | 10 KΩ |
| R4 | 10.15 KΩ |
| R5 | 10.5 KΩ |
| R6 | 10.5 KΩ |
| R7 | 10.5 KΩ |
| R8 | 10.5 KΩ |
| R9 | 10.5 KΩ |
| R10 | 10.5 KΩ |
| R11 | 20 KΩ |

TABLE 2

| FET | Type | Configuration |
| --- | --- | --- |
| FET1 | Enhancement | 2 × 25 |
| FET2 | Enhancement | 2 × 25 |
| FET3 | Enhancement | 2 × 25 |
| FET4 | Enhancement | 2 × 25 |
| FET5 | Enhancement | 2 × 25 |
| FET6 | Enhancement | 4 × 50 |
| FET7 | Enhancement | 4 × 50 |

TABLE 2-continued

| FET | Type | Configuration |
|---|---|---|
| FET8 | Enhancement | 2 × 25 |
| FET11 | Depletion | 1 × 10 |
| FET12 | Depletion | 1 × 10 |
| FET13 | Depletion | 1 × 10 |
| FET14 | Depletion | 1 × 10 |
| FET15 | Depletion | 1 × 10 |
| FET16 | Depletion | 1 × 10 |
| FET17 | Depletion | 1 × 10 |
| FET18 | Depletion | 1 × 10 |
| FET19 | Depletion | 1 × 10 |

In Table 2, a given configuration "n×a" in the third column refers to "n" fingers of "x" unit gate width (in μm).

Figure 3B:
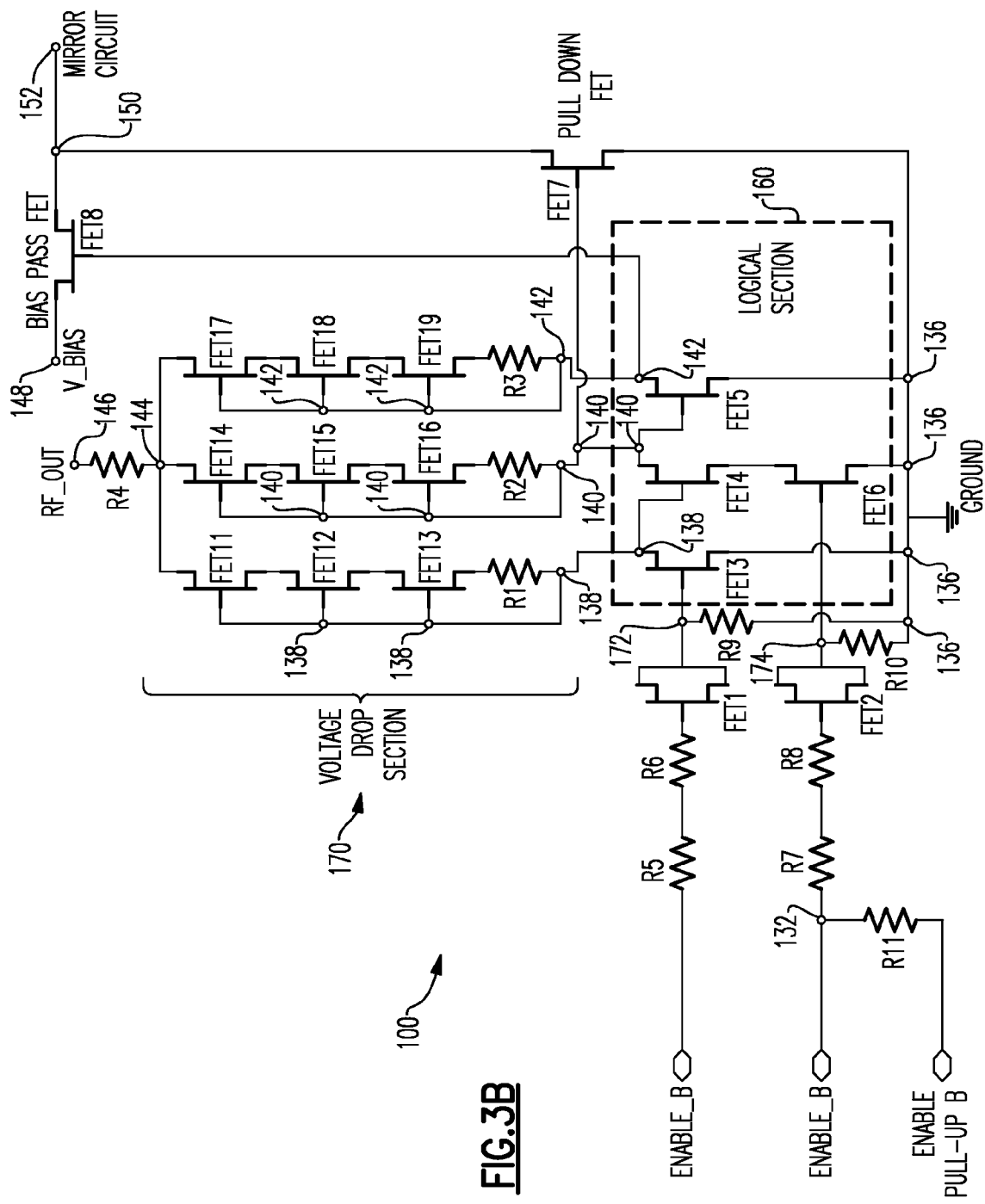
FIG. 3B shows an example of an alternate design of the enable circuit of FIG. 3A.

FIG. 3B shows an example configuration that can be an alternate design of the enable circuit 100 of FIG. 3A. In the example shown in FIG. 3B, grounding configurations through resistances R9 and R10 are different than their counterparts in the example of FIG. 3A. Other portions of the examples of FIGS. 3A and 3B can be generally the same.

As shown in FIG. 3B, R9 is shown to couple a node 172 (between FET1 and FET3) with node 136 of the ground. Similarly, R10 is shown to couple a node 174 (between FET2 and FET6) with node 136 of the ground. Since R9 is no longer connected to a node (130 in FIG. 3A) between R5 and R6, the resistances R5 and R6 may or may not be combined into one resistance. Similarly, since R10 is no longer connected to a node (134 in FIG. 3A) between R7 and R8, the resistances R7 and R8 may or may not be combined into one resistance.

With the example configurations of FIGS. 3A and 3B, and Tables 1 and 2, active high enable functionality (power shut-off at active low) and active enable low functionality (power shut-off at active high) can be achieved from the same enable circuit 100 by providing different combinations of signals for the ENABLE_A, ENABLE_B, and ENABLE PULL-UP B ports. Examples of such combinations are listed in Tables 3A-3C. Table 3A lists example combinations for the active high functionality, Table 3B lists example combinations for the active low functionality, and Table 3C lists example combinations to turn the LNA OFF.

TABLE 3A

Active High Functionality

| ENABLE_A | ENABLE_B | ENABLE PULL-UP B | LNA state |
|---|---|---|---|
| GND | Float | NC | OFF |
| GND | 0 V | NC | OFF |
| GND | 1.5 V | NC | ON |
| GND | 5 V | NC | ON |

TABLE 3B

Active Low Functionality

| ENABLE_A | ENABLE_B | ENABLE PULL-UP B | LNA state |
|---|---|---|---|
| Float | NC | RF_OUT - 5 V | ON |
| 0 V | NC | RF_OUT - 5 V | ON |
| 1.4 V | NC | RF_OUT - 5 V | ON |
| 1.5 V | NC | RF_OUT - 5 V | OFF |
| 5 V | NC | RF_OUT - 5 V | OFF |

TABLE 3C

LNA OFF

| ENABLE_A | ENABLE_B | ENABLE PULL-UP B | LNA state |
|---|---|---|---|
| 5 V | GND | NC | OFF |
| 5 V | 5 V | NC | OFF |

In Tables 3A-3C, "NC" refers to a "no connection" configuration.

In the examples described in reference to FIGS. 3A and 3B, and Tables 1-3, RF_OUT can be provided with a DC bias of approximately 5V. 5V can also go to an external resistance (e.g., a resistor) and then to V_BIAS. Based on Tables 3A-3C, one can see that active high can be achieved with a voltage of 1.5-5V at the ENABLE_B port. Similarly, active low can be achieved with a voltage of 0-1.4V at the ENABLE_A port.

Figure 4:
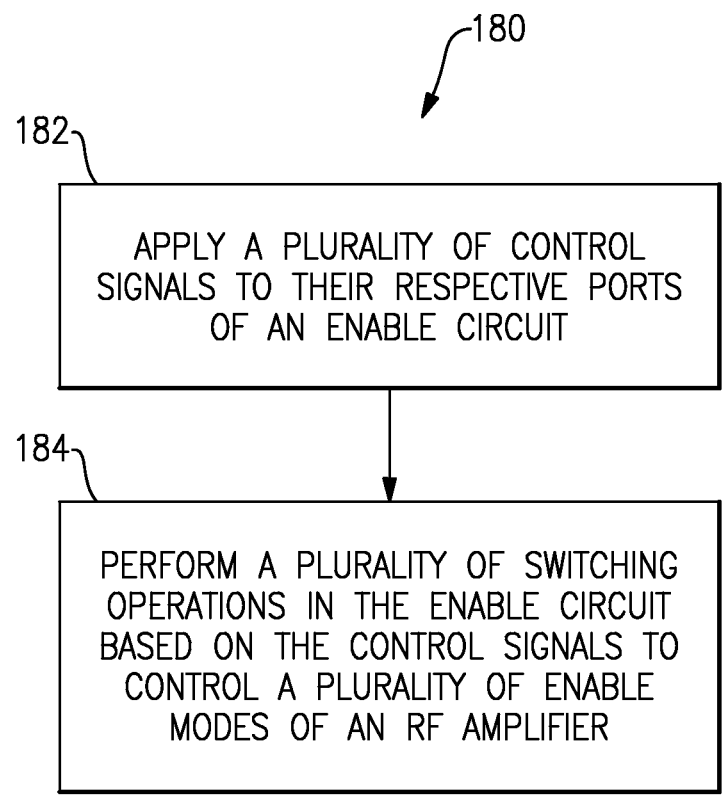
FIG. 4 shows a process that can be implemented utilizing an enable circuit having one or more features as described herein.

FIG. 4 shows a process 180 that can be implemented to achieve more than one enable modes of an RF amplifier. In block 182, a plurality of control signals can be applied to their respective ports of an enable or shut-down circuit. In some embodiments, such an enable circuit can be similar to an example shown in FIG. 3A or 3B. In block 184, a plurality of switching operations can be performed in the enable circuit based on the control signals to enable one of a plurality of enable-modes of an RF amplifier. In some embodiments, such enable-modes can include active high and active low functionalities.

Figure 5:
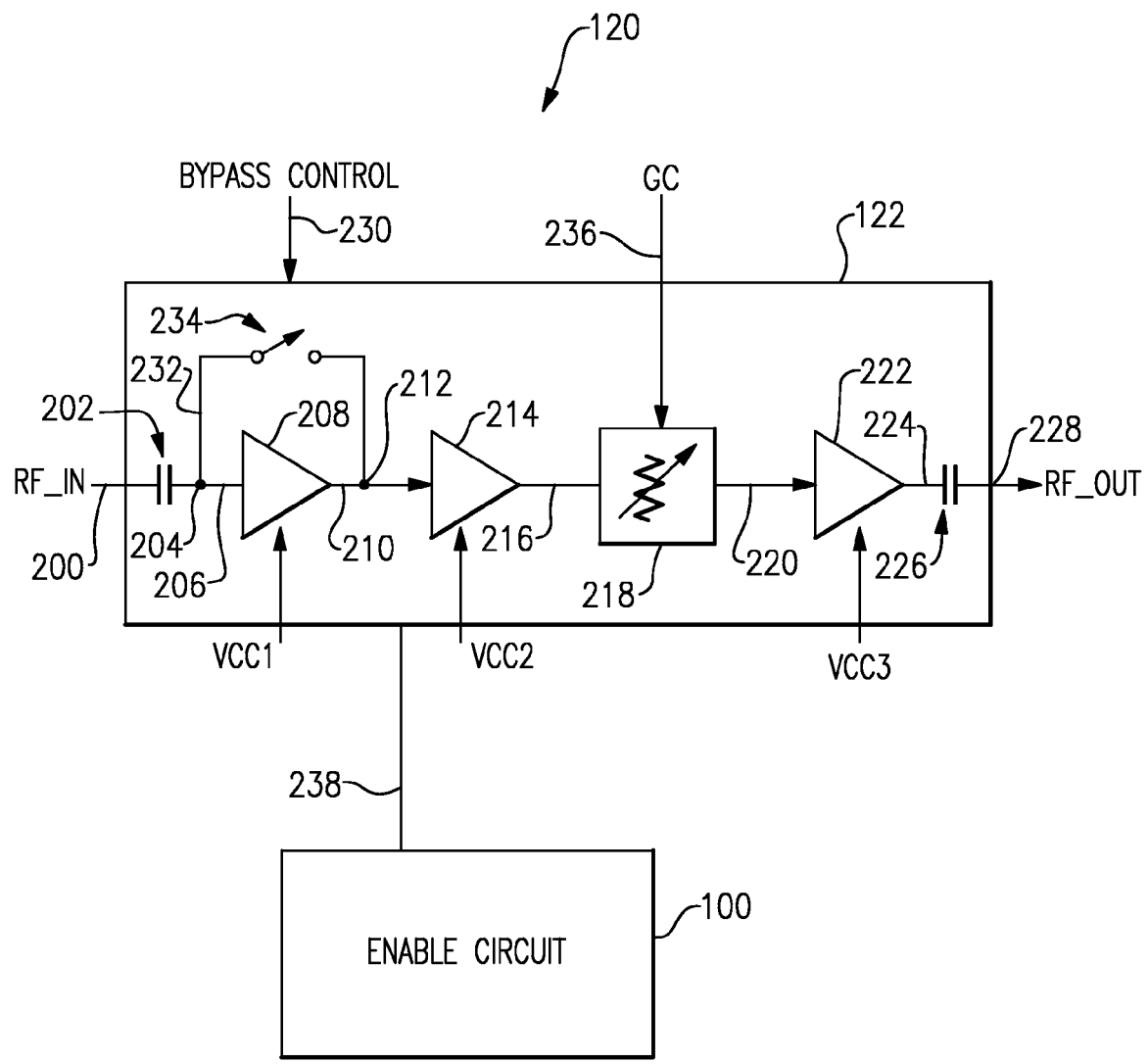
FIG. 5 shows an example configuration of a system that includes an LNA being controlled by an enable circuit having one or more features as described herein.

As described in reference to FIG. 2, an enable circuit 100 having one or more features described herein can be utilized to control an LNA 122. FIG. 5 shows a more detailed example of such a control configuration. In an example configuration 120 shown in FIG. 5, an LNA 122 can be a variable-gain LNA with an active bias and high linearity performance. An RF signal can be received at an input (RF_IN) 200, be amplified by a plurality of amplification stages. The amplified signal can then be provided at an output (RF_OUT) 228.

The LNA 122 can include a capacitance (e.g., a capacitor) 202 configured as a DC block. The input RF signal is then shown to be provided to a first stage 208 (through path 206). An output of the first stage 208 is shown to be provided to a second stage 214 (through path 210) which can be a high linearity driver amplifier. An output of the second stage 214 is shown to be provided to a variable voltage attenuator 218 (through path 216). An output of the attenuator 218 is shown to be provided to a third stage 222 (through path 220) which can be a high linearity power amplifier. An output of the third stage 222 is shown to be provided to the output 228 through a DC block capacitance (e.g., a capacitor) 226 (through path 224).

The example architecture of FIG. 5 can provide excellent return loss, low noise, and high linearity performance. The internal active bias circuitry can ensure repeatable performance over a temperature range. In some embodiments, the LNA 122 can be configured to provide high-linearity, active bias, low-noise and variable-gain functionalities in frequency ranges of, for example, 832-862 MHz, 814-849 MHz or 880-915 MHz. Such LNAs can be utilized for wireless applications such as, for example, LTE WCDMA infrastructure.

The example LNA 122 shown in FIG. 5 can operate in a high gain mode or a low gain mode. In the high gain mode, an RF signal can be amplified by each of the three stages 208, 214, 222. To achieve such a gain mode, a bypass path 232 can be in an open state by a switch 234 being opened (e.g., by a bypass control signal 230). In a low gain mode, the first stage 208 can be bypassed, so that an RF signal is amplified only by the second stage 214 and the third stage 222. To achieve such a gain mode, the bypass path 232 can be in a closed state by the switch 234 being closed (e.g., by a bypass control signal 230). Within a given gain mode, the variable voltage attenuator 218 can be utilized to vary the gain (e.g., by a gain control signal 236).

In the example configuration 120 of FIG. 5, an enable circuit 100 is shown to be in communication with the LNA 122 (depicted as line 238) to provide one or more enable/disable functionalities as described herein. In some embodiments, such an interaction between the enable circuit 100 and the LNA 122 can depend on how the amplification stages (e.g., 208, 214, 222) are configured.

Figure 6A:
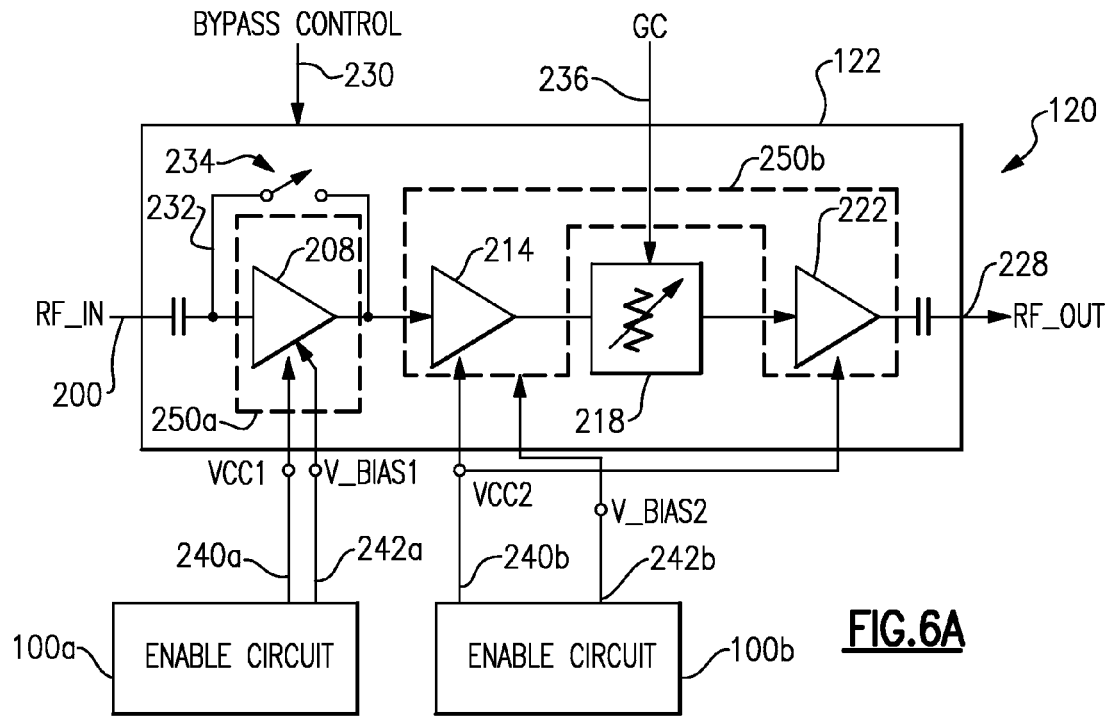
FIGS. 6A and 6B show examples of how the system of FIG. 5 can be implemented.

For example, FIG. 6A shows a configuration where the first stage 208 is on a first die 250a and the second and third stages 214, 222 are on a second die 250b. In such a configuration, a separate enable circuit can be provided for each die. For example, a first enable circuit 100a can be coupled to a high voltage node (VCC1, through path 240a) and a voltage bias node (V_BIAS1, through 242a) associated with the first stage amplifier 208 and provide one or more enable/disable functionalities as described herein. In another example, a second enable circuit 100b can be coupled to a high voltage node (VCC2, through path 240b) and a voltage bias node (V_BIAS2, through 242b) that can be commonly associated with the second and third stage amplifiers 214, 222 and provide one or more enable/disable functionalities as described herein for the two amplifiers (214, 222) of the second die 250b.

Figure 6B:
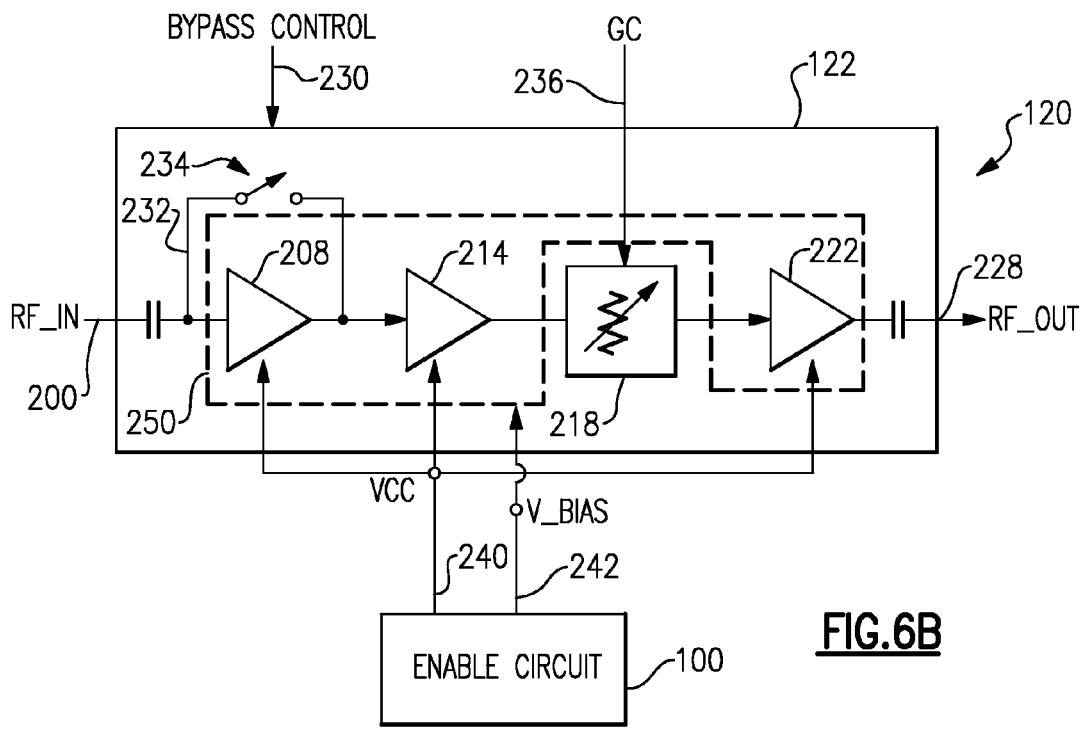

In another example, FIG. 6B shows a configuration all of the three stages 208, 214, 222 are on a single die 250. In such a configuration, a single enable circuit can be provided to control each of the three amplifier stages (208, 214, 222). For example, an enable circuit 100 can be coupled to a high voltage node (VCC, through path 240) that is common to the three amplifiers (208, 214, 222), and a voltage bias node (V_BIAS, through 242) that is also common to the three amplifiers (208, 214, 222), and provide one or more enable/disable functionalities as described herein.

In some embodiments, the enable circuits of FIGS. 6A and 6B can be implemented on the same die as their respective amplifiers. Similarly, a given die can also include, for example, an active biasing circuit that services each of the one or more amplifiers on that die. As described in FIGS. 7A-7D, other configurations are also possible.

Figure 7A:
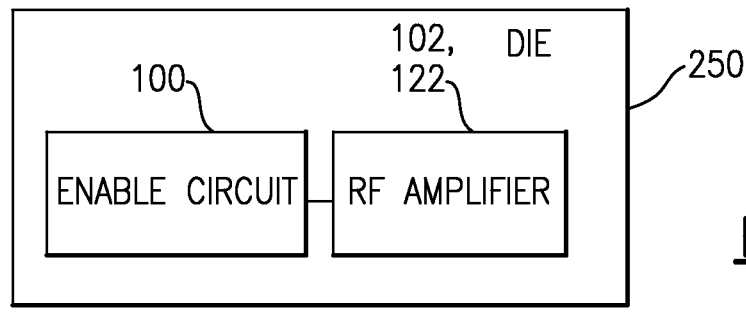
FIGS. 7A-7D show that an enable circuit having one or more features as described herein and an RF amplifier being controlled by the enable circuit can be implemented on one or more semiconductor die.
Figure 7B:
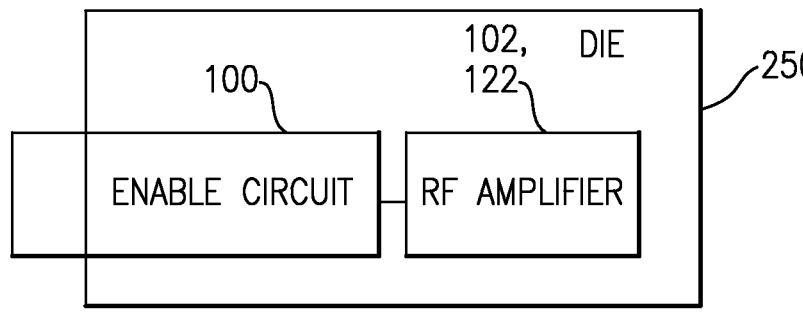

As described herein, examples of enable circuit configurations can be implemented in a number of different ways and at different product levels. Some of such product implementations are described by way of examples. FIGS. 7A-7D schematically show non-limiting examples of such implementations on one or more semiconductor die. FIG. 7A shows that in some embodiments, an enable circuit 100 having one or more features as described herein and an RF amplifier (102, 122) can be implemented on a die 250. FIG. 7B shows that in some embodiments, at least some of the enable circuit 100 can be implemented outside of the die 250 of FIG. 7A.

Figure 7C:
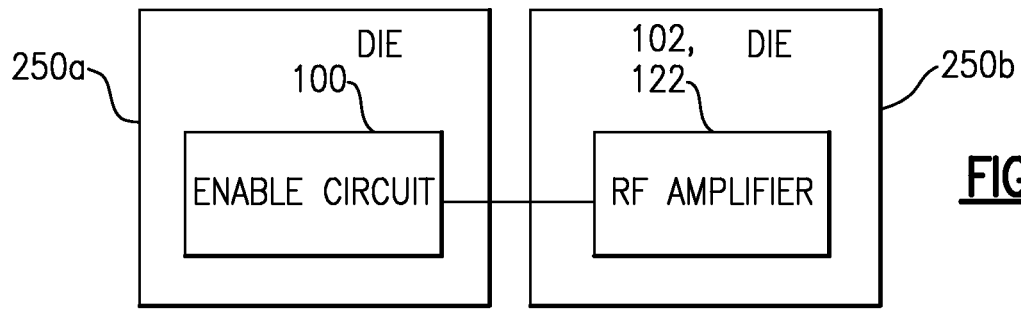
Figure 7D:
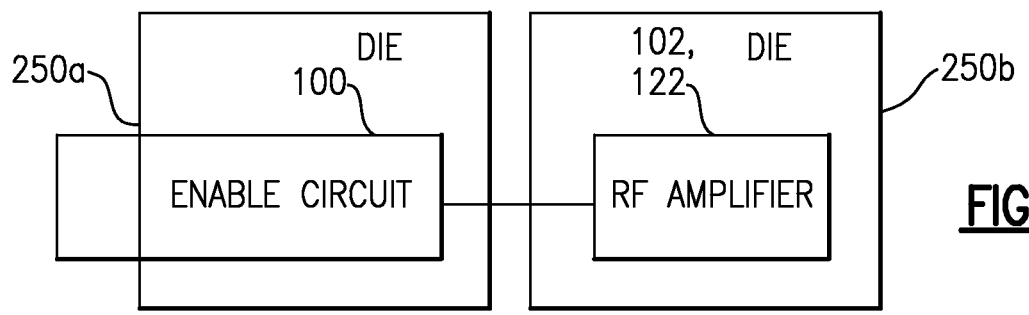

FIG. 7C shows that in some embodiments, an enable circuit 100 having one or more features as described herein can be implemented on a first die 250a, and an RF amplifier (102, 122) can be implemented on a second die 250b. FIG. 7D shows that in some embodiments, at least some of the enable circuit 100 can be implemented outside of the first die 250a of FIG. 7C.

Figure 8A:
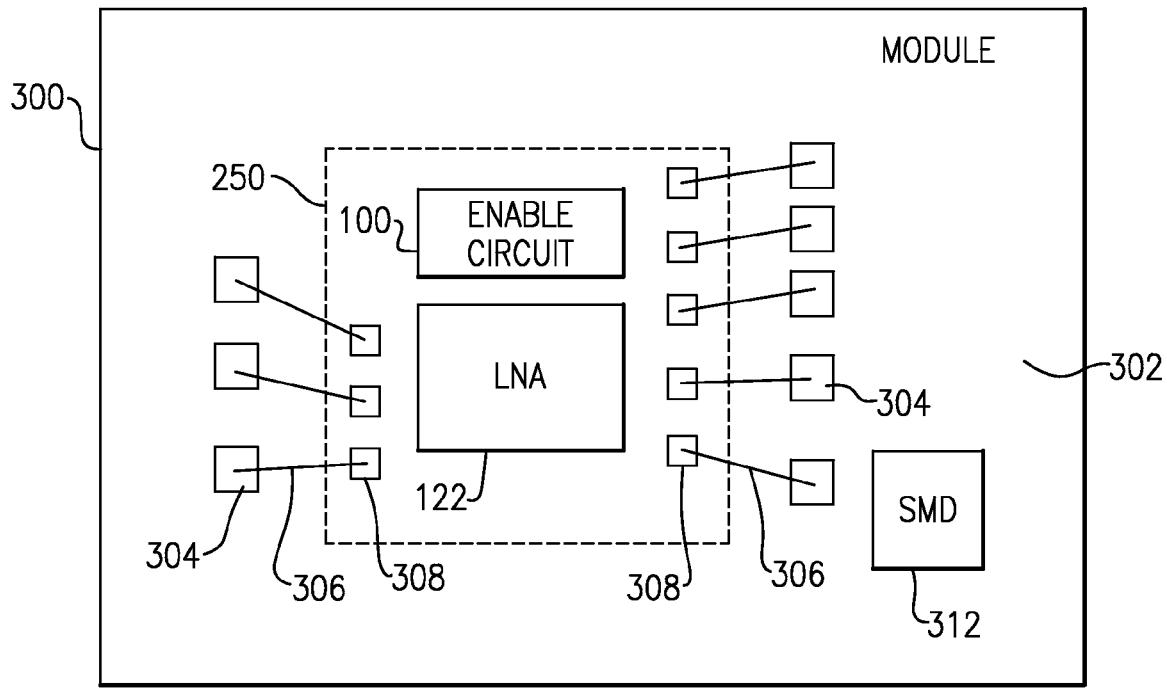
FIGS. 8A and 8B show that in some embodiments, the enable circuit and the RF amplifier of FIG. 7 can be implemented in a packaged module.

In some embodiments, one or more die having one or more features described herein can be implemented in a packaged module. An example of such a module is shown in FIGS. 8A (plan view) and 8B (side view). Although described in the context of both of an LNA 122 and the enable circuit 100 being on the same die 250 (e.g., example configuration of FIG. 7A), it will be understood that packaged modules can be based on other configurations. It will also be understood that although described in the context of an LNA, other types of RF amplifiers can also be implemented on such packaged modules.

A module 300 is shown to include a packaging substrate 302. Such a packaging substrate can be configured to receive a plurality of components, and can include, for example, a laminate substrate. The components mounted on the packaging substrate 302 can include one or more die. In the example shown, a die 250 having an LNA and an enable circuit 100 is shown to be mounted on the packaging substrate 302. The die 250 can be electrically connected to other parts of the module (and with each other where more than one die is utilized) through connections such as connection-wirebonds 306. Such connection-wirebonds can be formed between contact pads 308 formed on the die 250 and contact pads 304 formed on the packaging substrate 302. In some embodiments, one or more surface mounted devices (SMDs) 312 can be mounted on the packaging substrate 302 to facilitate various functionalities of the module 300.

In some embodiments, the packaging substrate 302 can include electrical connection paths for interconnecting the various components with each other and/or with contact pads for external connections. For example, a connection path 322 is depicted as interconnecting the SMD 312 with an external-connection contact pad 324. In yet another example a connection path 322 is depicted as interconnecting the die 200 with ground-connection contact pads 326.

In some embodiments, a space above the packaging substrate 302 and the various components mounted thereon can be filled with an overmold structure 320. Such an overmold structure can provide a number of desirable functionalities, including protection for the components and wirebonds from external elements, and easier handling of the packaged module 300.

Figure 9A:
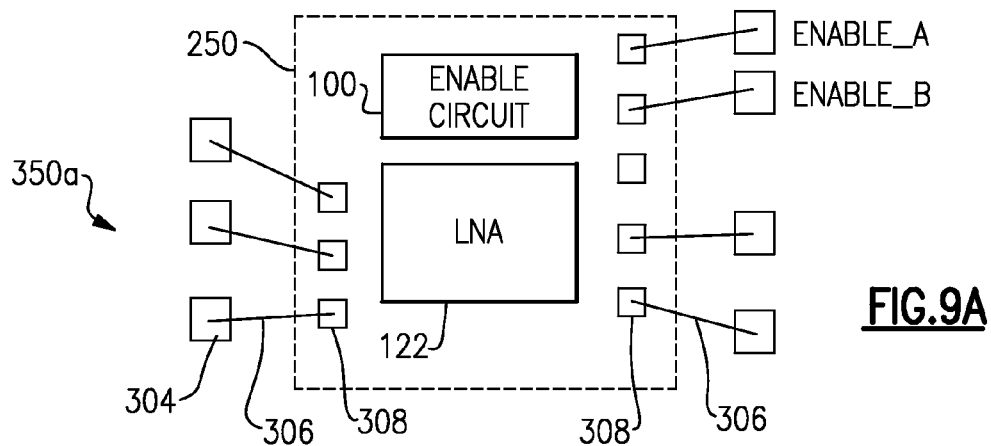
FIGS. 9A-9C show examples of how the enable circuit of FIG. 3A or 3B can be configured in a module such as the packaged module of FIG. 8.
Figure 9B:
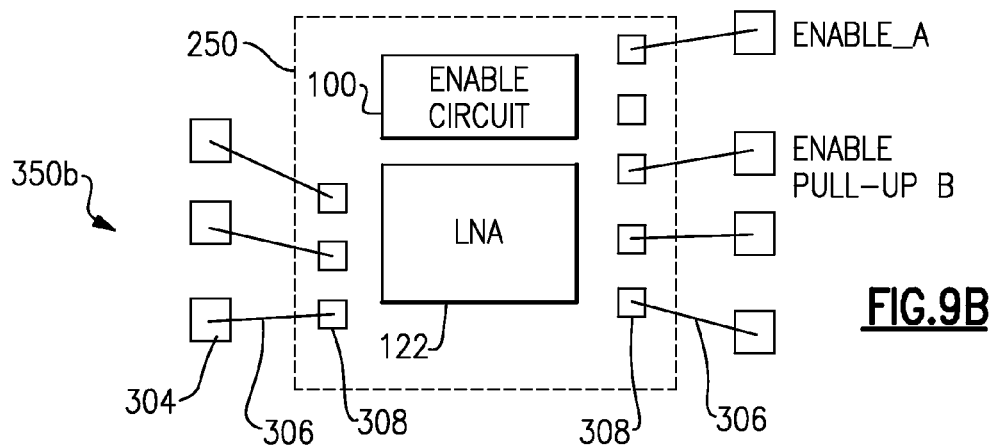
Figure 9C:
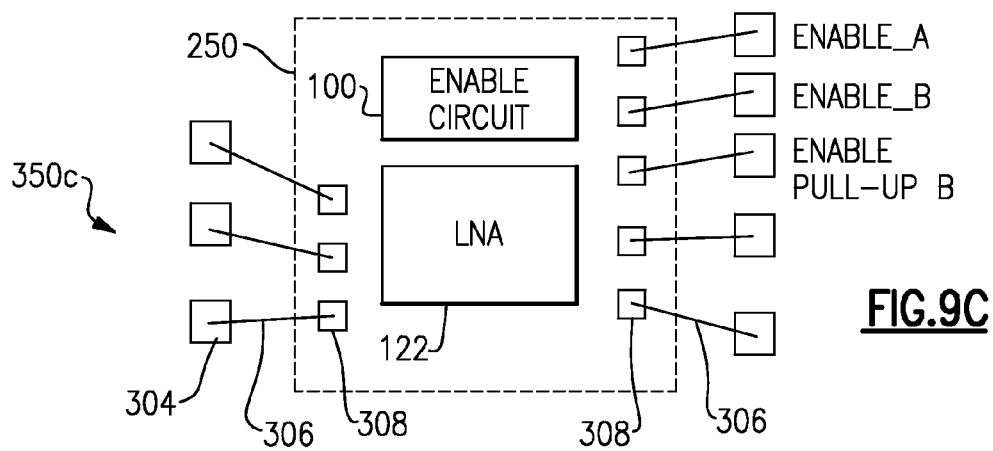

As described herein, more than one choice of enable functionality can be provided with the example enable circuits 100 of FIGS. 3A and 3B. Such different choices (e.g., active high and active low functionalities) can be facilitated by, for example, different layout on the enable circuit and/or the module substrate. FIGS. 9A-9C show examples of such different bonding layouts.

Figure 8B:
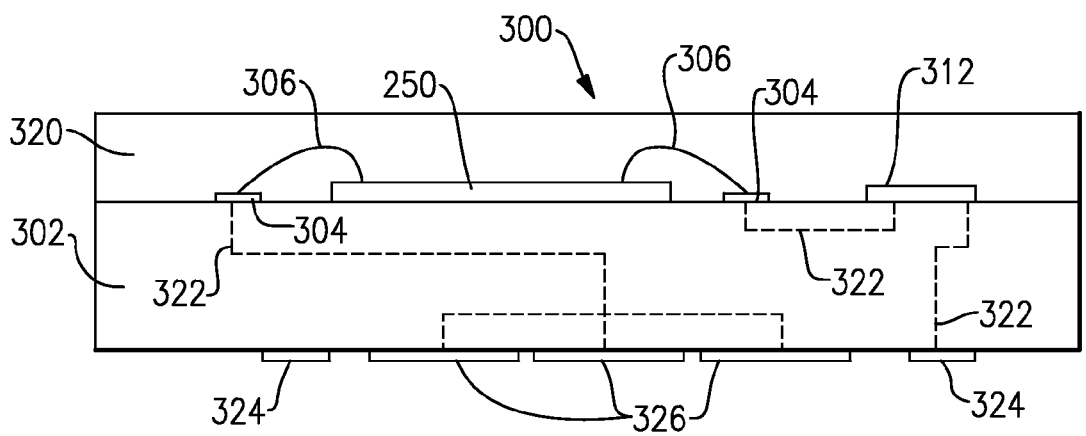

As an example, suppose that an LNA design calls for an active high functionality. FIG. 9A shows a bonding configuration 350a that can be implemented on a module (e.g., 300 in FIG. 8). In the example configuration 350a, connections are made for ENABLE_A and ENABLE_B, but not for ENABLE PULL-UP B; and such a configuration can be utilized to achieve an active high functionality as described in reference to Table 3A, where ENABLE PULL-UP B is not connected.

In another example, suppose that an LNA design calls for an active low functionality. FIG. 9B shows a bonding configuration 350b that can be implemented on a module (e.g., 300 in FIG. 8). In the example configuration 350b, connections are made for ENABLE_A and ENABLE PULL-UP B, but not ENABLE_B; and such a configuration can be utilized to achieve an active low functionality as described in reference to Table 3B, where ENABLE_B is not connected.

There may be situations where it is desirable to retain connections for all of the example controls ENABLE_A, ENABLE_B, and ENABLE PULL-UP B, and perform mode selections based on the combinations of control signals. FIG. 9C shows a bonding configuration 350c that can be implemented on a module (e.g., 300 in FIG. 8). In the example configuration 350c, connections are made for each of ENABLE_A, ENABLE_B, and ENABLE PULL-UP B; and such a configuration can be utilized to achieve either an active high functionality or an active low functionality as described herein.

Figure 10:
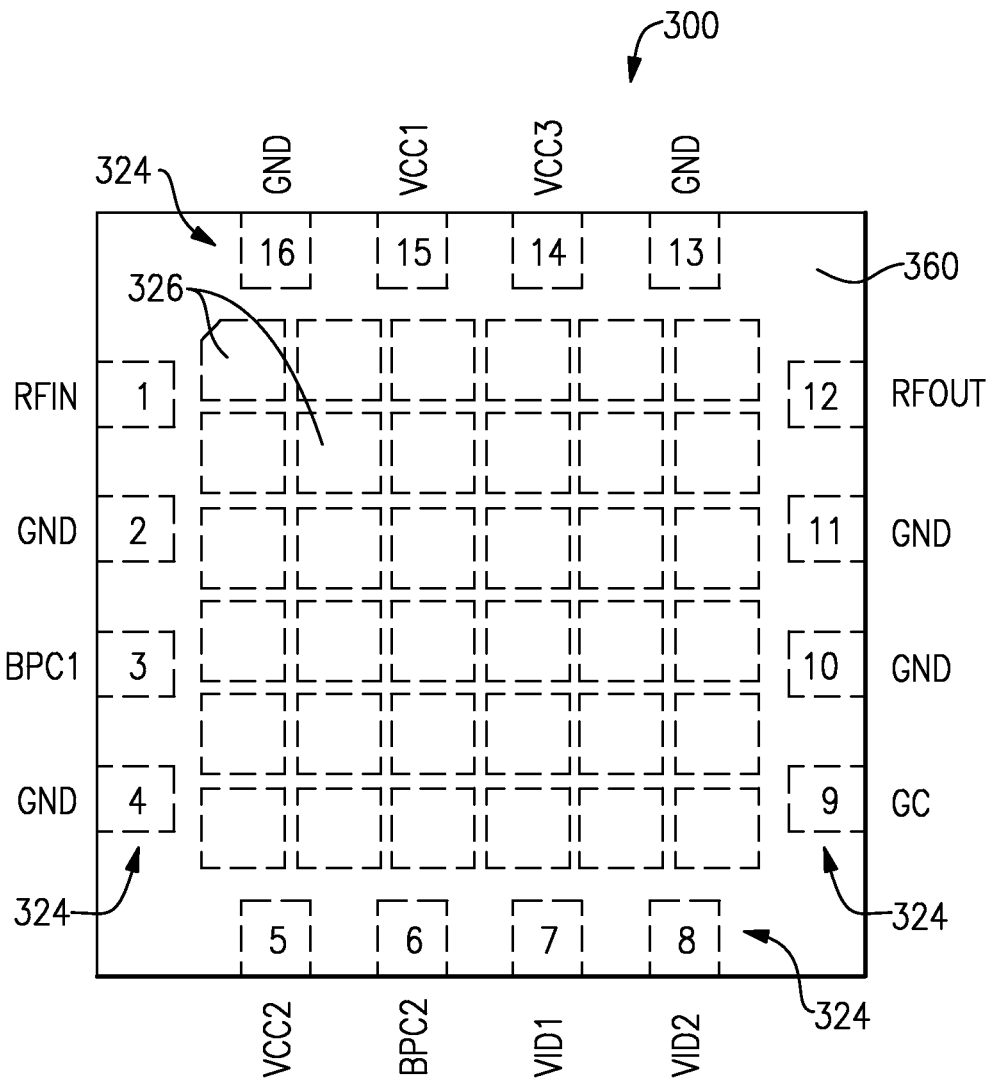
FIG. 10 shows an example pin configuration that can be implemented for a module having the system of FIG. 5.

In some embodiments, a packaged module having the example architecture 120 of FIG. 5 can be implemented to yield a device that is integrated and requires minimal external components. Such a packaged module can be a multi-chip module (MOM) that is compact (e.g., 8×8 mm). FIG. 10 shows an example pin configuration that can be implemented in such an MOM (300).

In the example pins 324 formed on a lower surface 360 of the MOM 300 are assigned as follows. Pins 1 and 12 are for input of an RF signal and output of an amplified RF signal. Pins 2, 4, 10, 11, 13 and 16 are grounding pins. Pins 3 (BPC1) and 6 (BPC2) are for operation of the bypass switch (234 in FIG. 5), where, for example, logic low in BPC1 and logic high in BPC2 can yield a high-gain mode (e.g., by opening the switch 234), and logic high in BPC1 and logic low in BPC2 can yield a low-gain mode (e.g., by closing the switch 234). Pin 15 (VCC1) is for the supply voltage to the first stage 208. Pin 5 (VCC2) is for the supply voltage to the second stage 214. Pin 14 is for the supply voltage to the third stage 222. Pins 7 (VID1) and 8 (VID2) are for vendor identification.

As further shown in FIG. 10, grounding pads 326 are formed in a center region. The grounding pads 326 are internally connected to the grounding pins 2, 4, 10, 11, 13 and 16. Such grounding pads can be utilized for grounding purpose, as well as to facilitate conduction of heat away from the MOM 300.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a handheld wireless device with or without phone functionality, a wireless tablet, etc.

Figure 11:
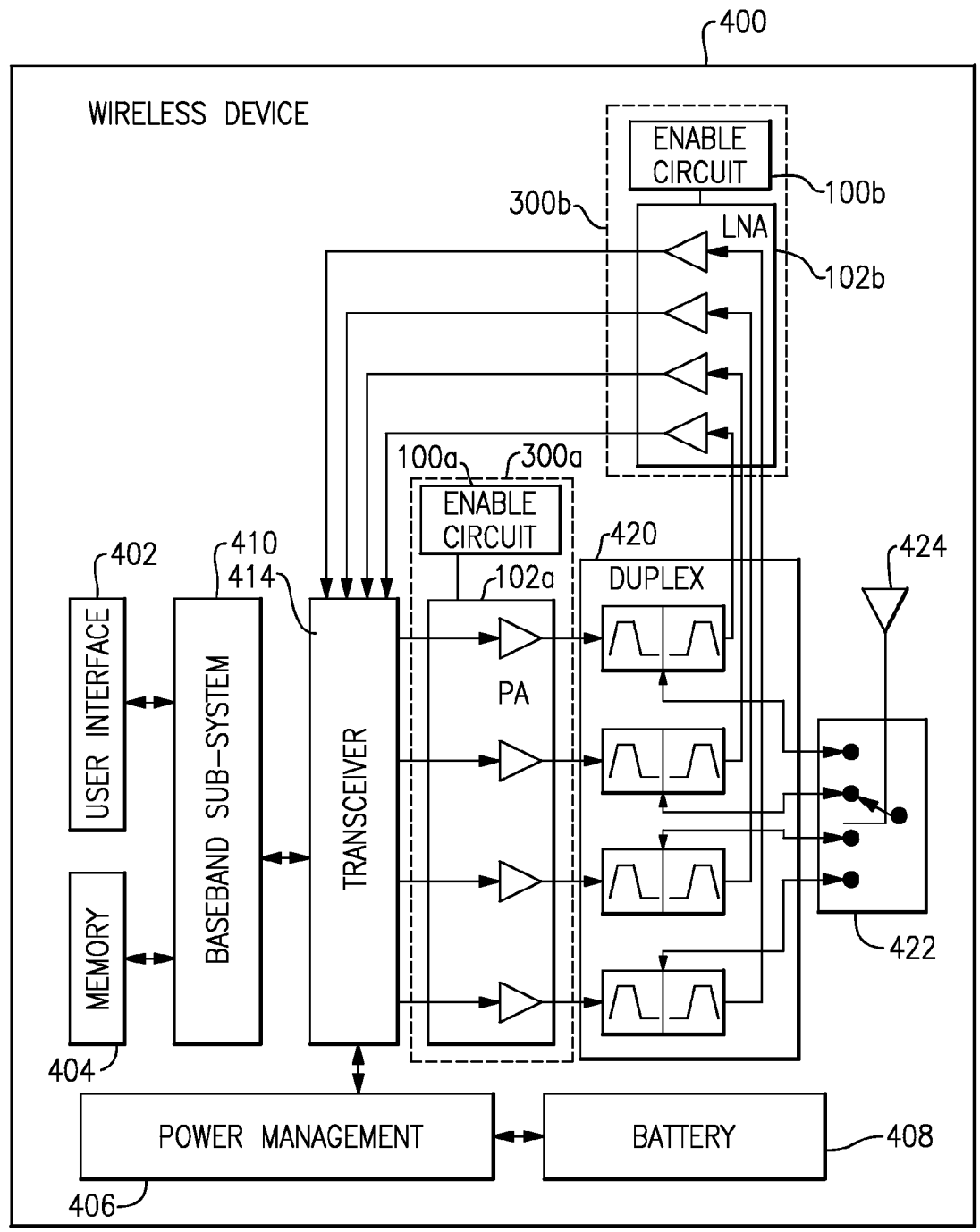
FIG. 11 schematically depicts an example of a wireless device having one or more desirable features as described herein.

FIG. 11 schematically depicts an example wireless device 400 having one or more advantageous features described herein. In the context of various RF amplifiers and various enable circuit configurations as described herein, a power amplifier (PA) 102a and its enable circuit 100a can be part of a module 300a. An LNA 102b and its enable circuit 100b can be part of a module 300b. In some embodiments, the wireless 400 can include either or both of the modules 300a, 300b.

In the example wireless device 400, the PA module 300a having a plurality of PAs can provide an amplified RF signal to the switch 422 (via a duplexer 420), and the switch 422 can route the amplified RF signal to an antenna 424. The PA module 300a can receive an unamplified RF signal from a transceiver 414 that can be configured and operated in known manners. Various operations of the PA 102a can be facilitated by the enable circuit 100a as described herein.

The transceiver 414 can also be configured to process received signals. Such received signals can be routed to the LNA 102b from the antenna 424, through the duplexer 420. Various operations of the LNA 102b can be facilitated by the enable circuit 100b as described herein.

The transceiver 414 is shown to interact with a baseband sub-system 410 that is configured to provide conversion between data and/or voice signals suitable for a user and RF signals suitable for the transceiver 414. The transceiver 414 is also shown to be connected to a power management component 406 that is configured to manage power for the operation of the wireless device 400. Such a power management component can also control operations of the baseband sub-system 410 and the module(s) 300a and/or 300b.

The baseband sub-system 410 is shown to be connected to a user interface 402 to facilitate various input and output of voice and/or data provided to and received from the user. The baseband sub-system 410 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation (s), algorithm (s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An enable circuit for a radio-frequency (RF) amplifier, the enable circuit comprising:
    a plurality of input ports, each configured to receive a control signal; and
    a logical section connected to the input ports and configured to be capable of generating a plurality of output signals based on different combinations of the plurality of control signals, the output signals including a first set of output signals to control a power state of the RF amplifier in a first enable mode and a second set of output signals to control the power state the RF amplifier in a second enable mode.

2. The enable circuit of claim 1 wherein the RF amplifier is a low-noise amplifier (LNA).

3. The enable circuit of claim 1 wherein the plurality of input ports includes a first input port, a second input port, and a third input port.

4. The enable circuit of claim 3 wherein the third input port being unconnected and the first input port being provided with a ground potential results in one of the first set of output signals.

5. The enable circuit of claim 4 wherein the second input port being floated or provided with a voltage less than approximately 1.5V results in the RF amplifier being OFF and the second input port being provided with a voltage of approximately 1.5V of higher results in the RF amplifier being ON.

6. The enable circuit of claim 4 wherein the first enable mode is an active high enable mode.

7. The enable circuit of claim 3 wherein the second input port being unconnected and the third input port being provided with a voltage of approximately 5V results in one of the second set of output signals.

8. The enable circuit of claim 7 wherein the first input port being floated or provided with a voltage less than approximately 1.5V results in the RF amplifier being ON and the first input port being provided with a voltage of approximately 1.5V or higher results in the RF amplifier being OFF.

9. The enable circuit of claim 7 wherein the second enable mode is an active low enable mode.

10. The enable circuit of claim 1 wherein the logical section includes a first field-effect transistor (FET), a second FET, and a third FET, each FET having a gate, a source, and a drain, each source connected to a ground, each drain connected to a respective voltage source, the gate of the first FET coupled to a first input port, the gate of the second FET coupled to the drain of the first FET, the gate of the third FET coupled to the drain of the second FET.

11. The enable circuit of claim 10 wherein the logical section further includes a fourth FET having a gate, a source, and a drain, the gate of the fourth FET coupled to a second input port, the drain of the fourth FET coupled to the source of the second FET, the source of the fourth FET coupled to the ground.

12. The enable circuit of claim 10 further comprising a pull down FET implemented between a source of a bias voltage and the ground, the pull down FET configured to allow the bias voltage to be shunted away from the RF amplifier, the pull down FET having a gate coupled to the drain of the second FET, a drain coupled to the source of the bias voltage, and a source coupled to the ground.

13. A method for generating control signals for a radio-frequency (RF) amplifier, the method comprising:
applying a plurality of control signals to their respective ports of an enable circuit; and
performing a plurality of switching operations in the enable circuit based on the control signals, different combinations of the control signals yielding a plurality of different output signals, the different output signals including a first set of output signals to control a power state of the RF amplifier in a first enable mode and a second set of output signals to control the power state the RF amplifier in a second enable mode.

14. A radio-frequency (RF) amplifier module comprising:
a packaging substrate configured to receive a plurality of components;
a semiconductor die mounted on the packaging substrate, the die including an RF amplifier; and
an enable circuit coupled to the RF amplifier and configured to be capable of generating a plurality of different output signals for the RF amplifier based on different combinations of a plurality of control signals, the different output signals including a first set of output signals to control a power state of the RF amplifier in a first enable mode and a second set of output signals to control the power state the RF amplifier in a second enable mode.

15. The module of claim 14 wherein the enable circuit is part of the same semiconductor die as the RF amplifier.

16. The module of claim 15 further comprising an active bias circuit implemented on the same semiconductor die as the enable circuit and the RF amplifier.

17. The module of claim 14 wherein the enable circuit is part of another die mounted on the packaging substrate.

18. The module of claim 14 wherein the enable circuit is disposed at a location outside of the semiconductor die.

19. The module of claim 14 wherein the module is a power amplifier module (PAM).

20. The module of claim 14 wherein the module is a low-noise amplifier (LNA) module.

* * * * *